US011864363B2

(12) United States Patent
Tang

(10) Patent No.: US 11,864,363 B2
(45) Date of Patent: Jan. 2, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Chihshun Tang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 212 days.

(21) Appl. No.: 17/419,287

(22) PCT Filed: Apr. 19, 2021

(86) PCT No.: PCT/CN2021/088162
§ 371 (c)(1),
(2) Date: Jun. 28, 2021

(87) PCT Pub. No.: WO2022/198733
PCT Pub. Date: Sep. 29, 2022

(65) Prior Publication Data
US 2023/0156982 A1 May 18, 2023

(30) Foreign Application Priority Data
Mar. 26, 2021 (CN) .......................... 202110325794.9

(51) Int. Cl.
*H05K 7/20* (2006.01)

(52) U.S. Cl.
CPC ............................. *H05K 7/20963* (2013.01)

(58) Field of Classification Search
CPC .................................................. H05K 7/20963
See application file for complete search history.

(56) References Cited

U.S. PATENT DOCUMENTS

2012/0281167 A1   11/2012   Nakatsuka
2020/0147923 A1*  5/2020   Shi ............................ B32B 1/00
2021/0034121 A1*  2/2021   Lee ..................... H05K 7/20963

FOREIGN PATENT DOCUMENTS

CN       104701353 A       6/2015
CN       109585461 A       4/2019
(Continued)

OTHER PUBLICATIONS

CN 111354267 A, English translation (Year: 2020).*

*Primary Examiner* — Mukundbhai G Patel
(74) *Attorney, Agent, or Firm* — PV IP PC; Wei Te Chung; Zhigang Ma

(57) ABSTRACT

The present application provides a display panel and a display device. The display panel includes a panel main body and a heat dissipation layer disposed on one side of the panel main body. The panel main body includes a first body portion. The heat dissipation layer includes a first heat dissipation portion corresponding to the first body portion. A surface of the first heat dissipation portion on one side away from the panel main body is a non-flat surface, so that a contact area of the heat dissipation layer with an outside of the display panel is increased, to avoid display abnormalities on the display panel due to poor heat dissipation.

18 Claims, 7 Drawing Sheets

(56) References Cited

FOREIGN PATENT DOCUMENTS

| | | | | |
|---|---|---|---|---|
| CN | 111354267 A | * | 6/2020 | ............. H01K 71/00 |
| CN | 111628110 A | | 9/2020 | |
| CN | 111816083 A | | 10/2020 | |
| CN | 112071207 A | | 12/2020 | |
| CN | 112165837 A | | 1/2021 | |
| CN | 112234152 A | | 1/2021 | |
| CN | 112309251 A | | 2/2021 | |
| CN | 112351662 A | | 2/2021 | |
| JP | 2007298615 A | | 11/2007 | |

\* cited by examiner

DISPLAY PANEL AND DISPLAY DEVICE

RELATED APPLICATIONS

This application is a Notional Phase of PCT Patent Application No. PCT/CN2021/088162 having international filing date of Apr. 19, 2021, which claims the benefit of priority of Chinese Patent Application No. 202110325794.9 filed on Mar. 26, 2021. The contents of the above applications are all incorporated by reference as if fully set forth herein in their entirety.

FIELD OF DISCLOSURE

The present application relates to a field of display technology and in particular to a display panel and a display device.

DESCRIPTION OF RELATED ART

In order to avoid interference of electromagnetic fields, heat, and other factors on a display panel, a heat dissipation layer is provided on a back of a display panel to realize functions such as force buffer, electromagnetic shielding, and heat dissipation. In a heat dissipation layer, a copper foil sheet for shielding and heat dissipation is located on an outermost side, and heat generated by a driving chip and a circuit board of the display panel needs to be transferred to the copper foil sheet through multiple film layers in the heat dissipation layer. Therefore, if materials of the heat dissipation layer are improper, or adhesion between the heat dissipation layer and the display panel is weak, it will cause uneven heat transfer/conduction, resulting in concentrated high temperature heating in some areas of the display panel, and abnormal display functions (e.g., a long recovery time when the display panel has an afterimage problem), which affects service life of the device.

SUMMARY

The present application provides a display panel and a display device, which can improve the problems of abnormal functions of the display panel caused by poor heat dissipation.

The present application provides a display panel, comprising:

a panel main body comprising a first body portion; and a heat dissipation layer disposed on one side of the panel main body, the heat dissipation layer comprising a first heat dissipation portion corresponding to the first body portion, wherein a surface of the first heat dissipation portion on one side away from the panel main body is a non-flat surface.

Preferably, in some embodiments of the present application, the first heat dissipation portion comprises a plurality of first protrusions arranged on one side of the first heat dissipation portion away from the panel main body.

Preferably, in some embodiments of the present application, the first body portion and the first heat dissipation portion are in a bent state.

Preferably, in some embodiments of the present application, the panel main body further comprises a second body portion connected to a side portion of the first body portion, the first body portion has a first curvature, and the second body portion has a second curvature less than the first curvature; and the heat dissipation layer comprises a second heat dissipation portion corresponding to the second body portion, and the second heat dissipation portion comprises a plurality of second protrusions arranged on one side of the second heat dissipation portion away from the panel main body.

Preferably, in some embodiments of the present application, a number of the first protrusions per unit area is greater than or equal to a number of the second protrusions per unit area.

Preferably, in some embodiments of the present application, the number of the first protrusions per unit area is n1, and the number of the second protrusions per unit area is n2, wherein 60≤n1≤120, and 30≤n2≤60.

Preferably, in some embodiments of the present application, an axial section of each of the first protrusions comprises a first included angle away from the panel main body, an axial section of each of the second protrusions comprises a second included angle away from the panel main body, and the first included angle is less than or equal to the second included angle.

Preferably, in some embodiments of the present application, the first included angle is α and the second included angle is β, wherein 45°≤α≤75°, and 75°≤β≤120°.

Preferably, in some embodiments of the present application, the first protrusions and the second protrusions have a same height.

Preferably, in some embodiments of the present application, the height of each of the first protrusions is less than or equal to half of a thickness of the first heat dissipation portion, and/or the height of each of the second protrusions is less than or equal to half of a thickness of the second heat dissipation portion.

Preferably, in some embodiments of the present application, the first protrusions and the second protrusions are formed by an imprinting process.

Preferably, in some embodiments of the present application, the second body portion is in a flat state, the panel main body further comprises a bonding portion connected to an end of the second body portion, and the bonding portion has a third curvature less than the first curvature; and the heat dissipation layer comprises a third heat dissipation portion corresponding to the bonding portion, and the third heat dissipation portion comprises a plurality of third protrusions on one side of the third heat dissipation portion away from the panel main body.

Preferably, in some embodiments of the present application, the heat dissipation layer comprises a metal layer, and the metal layer comprises the first heat dissipation portion, the second heat dissipation portion, and the third heat dissipation portion.

Preferably, in some embodiments of the present application, the metal layer is copper foil.

Preferably, in some embodiments of the present application, the heat dissipation layer further comprises a buffer layer and a thermally conductive layer, the thermally conductive layer is disposed between the buffer layer and the metal layer, and the buffer layer is disposed between the panel main body and the thermally conductive layer.

Preferably, in some embodiments of the present application, shapes of the first protrusions and/or the second protrusions comprise a prismatic shape, a semi-cylindrical shape, and a truncated pyramidal shape.

Preferably, in some embodiments of the present application, at least one of the first protrusions comprises a first side surface which is parallel to a corresponding portion of the first body portion and arranged on one side away from the panel main body; and/or at least one of the second protrusions comprises a second side surface which is parallel to a corresponding portion of the second body portion and arranged on one side away from the panel main body.

The present application further provides a display device comprising any one of the above-mentioned display panels.

The present application provides the display panel and the display device. Compared with conventional techniques, the display panel comprises a panel main body and a heat dissipation layer. The panel main body comprises a first body portion. The heat dissipation layer is disposed on one side of the panel main body, the heat dissipation layer comprises a first heat dissipation portion corresponding to the first body portion, and a surface of the first heat dissipation portion on one side away from the panel main body is a non-flat surface, so as to increase a surface area of the first heat dissipation portion, thereby increasing a contact area of the heat dissipation layer with an outside of the display panel, so that heat generated in the display panel can be transferred faster to the outside of the display panel through the first heat dissipation portion, which is beneficial to improve a problem of poor heat dissipation of the display panel in the first body portion, and can avoid display abnormalities on the display panel resulting from poor heat dissipation.

BRIEF DESCRIPTION OF DRAWINGS

The present application is described in detail below in conjunction with the accompanying drawings for ease of understanding the technical solutions and other beneficial effects of the present application.

DETAILED DESCRIPTION OF EMBODIMENTS

A detailed description of the present application is provided in conjunction with the accompanied drawings and with reference to specific embodiments to make the purpose, technical solutions, and effects of the present application clear and definite. It should be understood that the specific embodiments described herein are only used to explain the present application, and are not used to limit the present application.

The present application provides a display panel and a display device. Detailed descriptions are provided below. It should be noted that an order of describing the following embodiments is not intended to limit an order of preference of the embodiments.

Figure 1A:
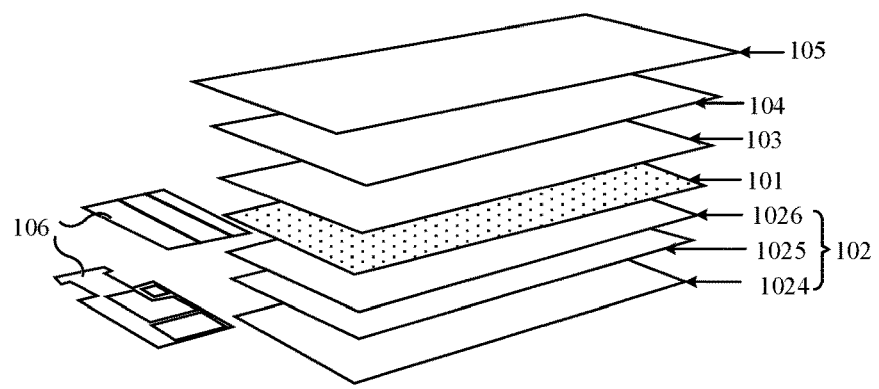
FIGS. 1A to 1B are schematic structural views illustrating a display panel according to the present application.
Figure 1B:
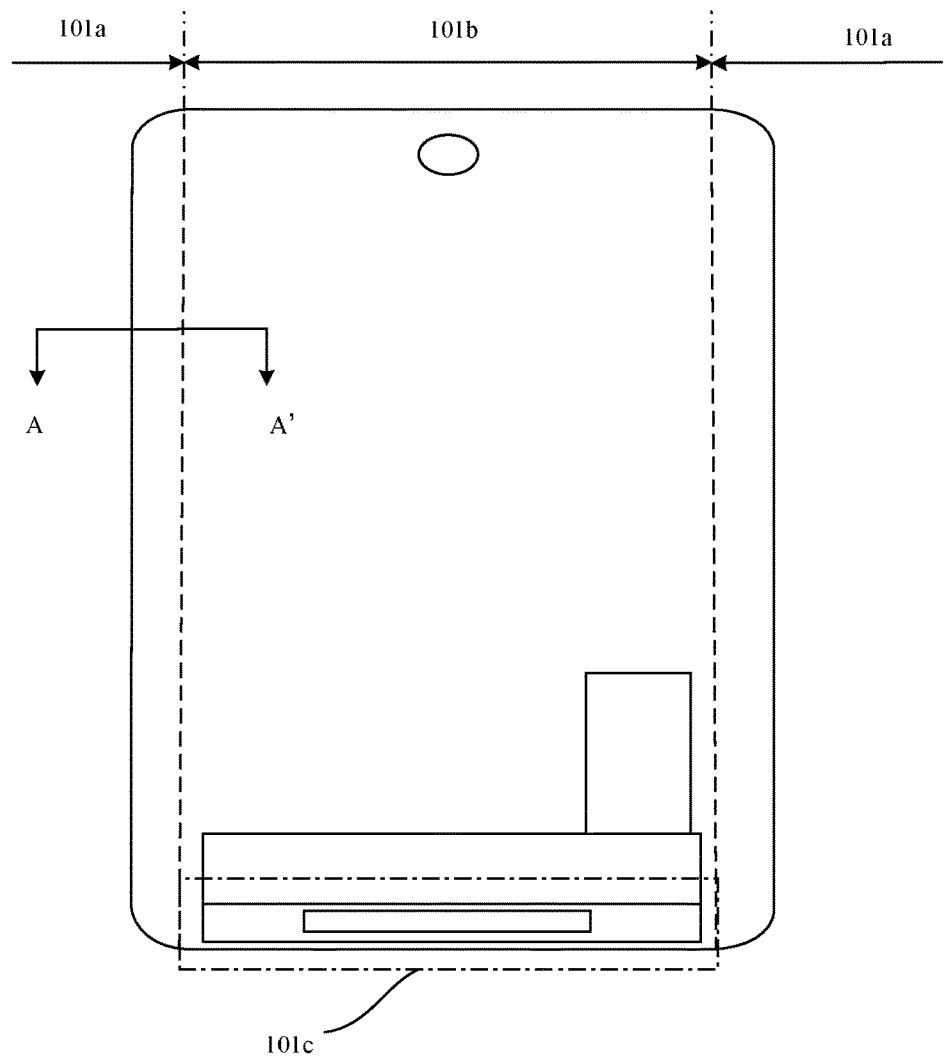
Figure 1C:
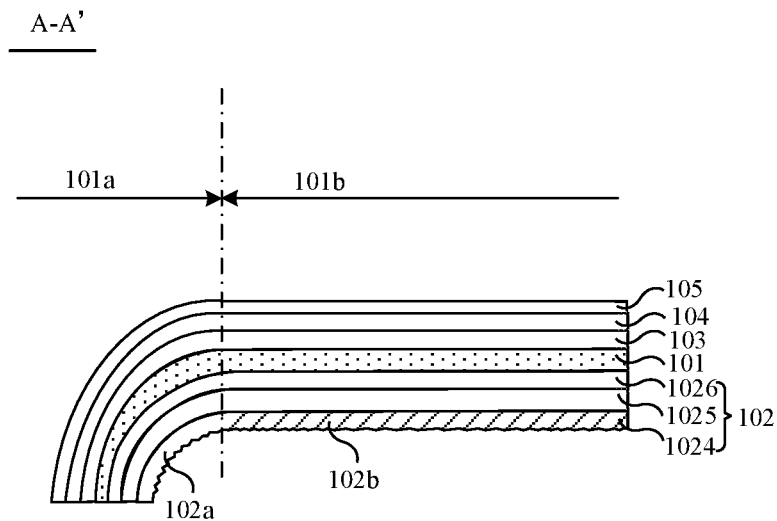
FIGS. 1C to 1D are cross-sectional views of the display panel shown in FIG. 1B taken along line A-A'.
Figure 1D:
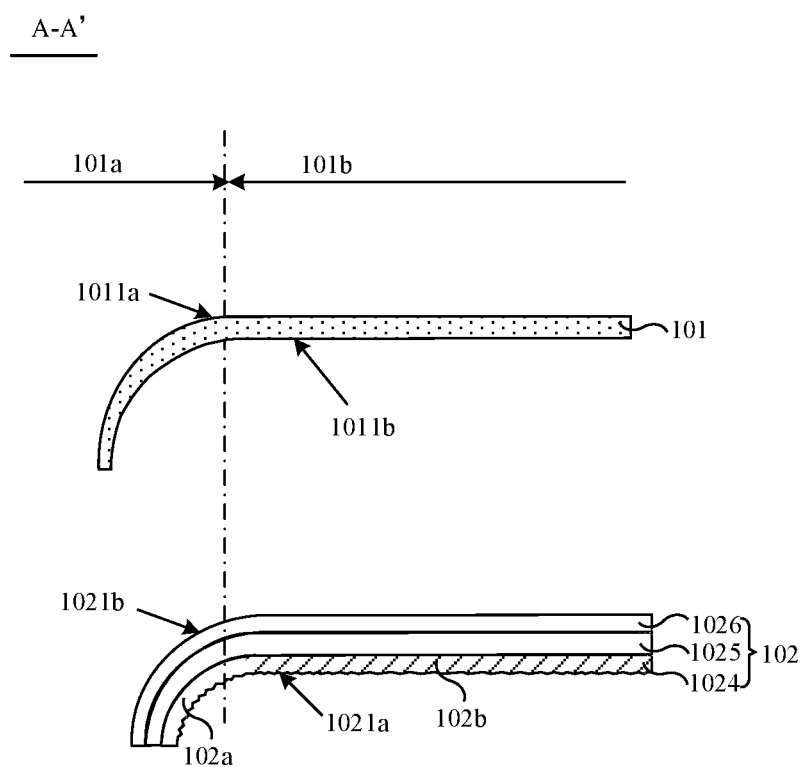

Please refer to FIGS. 1A to 1B for structural views illustrating a display panel according to the present application. FIGS. 1C to 1D are cross-sectional views illustrating the display panel shown in FIG. 1B taken along line A-A'. The present application provides a display panel. Optionally, the display panel comprises a self-luminous display panel, a passive luminous display panel, and a quantum dot display panel. Optionally, the display panel comprises a flexible display panel, a rigid display panel, a curved-screen display panel.

The display panel comprises a panel main body 101 and a heat dissipation layer 102. The panel main body 101 comprises a first body portion 101a. The heat dissipation layer 102 is disposed on one side of the panel main body 101, the heat dissipation layer 102 comprises a first heat dissipation portion 102a corresponding to the first body portion 101a, and a surface 1021a of the first heat dissipation portion 102a on one side away from the panel main body 101 is a non-flat surface, so as to increase a surface area of the first heat dissipation portion 102a, thereby increasing a contact area of the heat dissipation layer 102 with an outside of the display panel, so that heat generated in the display panel can be transferred faster to the outside of the display panel through the first heat dissipation portion 102a, which is beneficial to improve a problem of poor heat dissipation of the display panel in the first body portion 101a, and can avoid display abnormalities of the display panel resulting from poor heat dissipation.

Specifically, please continue to refer to FIG. 1D, the panel main body 101 comprises a first surface 1011a and a second surface 1011b opposite to each other. The heat dissipation layer 102 comprises a third surface 1021a and a fourth surface 1021b opposite to each other. If the first surface 1011a is a display side, and the fourth surface 1021b is adjacent to the second surface 1011b, then a portion of the third surface 1021a corresponding to the first body portion 101a is the third surface 1021a of the first heat dissipation portion 102a on one side away from the panel main body 101. The third surface 1021a corresponding to the first body portion 101a is a non-flat surface, that is, the third surface 1021a of the first heat dissipation portion 102a on one side away from the panel main body 101 is a non-flat surface.

Optionally, the first body portion 101a can be arranged corresponding to a plane area of the display panel, or corresponding to a bending area of the display panel. When the first body portion 101a is arranged corresponding to the plane area of the display panel, the first body portion 101a is in a flat state, and the first heat dissipation portion 102a is also in the flat state along with the first body portion 101a. When the first body portion 101a is arranged corresponding to the bending area of the display panel, the first body portion 101a is in a bent state, and the first heat dissipation portion 102a is also in the bent state along with the first body portion 101a. It should be noted that the bending area comprises a dynamic bending area and a static bending area.

Figure 2A:
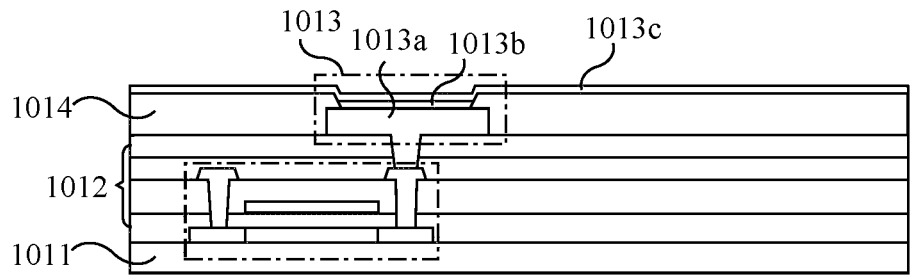
FIGS. 2A to 2B are schematic structural views illustrating a panel main body according to the present application.
Figure 2B:
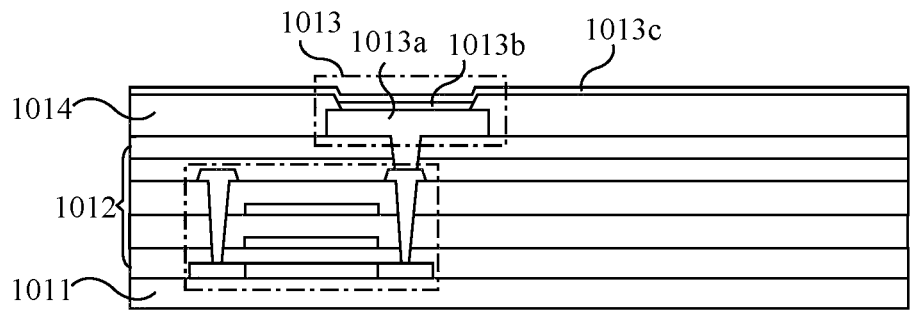

Please refer to FIG. 2A to FIG. 2B, which are schematic structural views illustrating the panel main body according to the present application. The display panel is a self-luminous display panel, and the panel main body 101 comprises a substrate 1011, and a drive array layer 1012 and a light-emitting device 1013 arranged on the substrate 1011. Wherein, the drive array layer 1012 comprises a plurality of transistors, and the transistors comprise a field effect transistor. Furthermore, the transistors comprise a thin film transistor. The transistors comprise oxide transistors and silicon transistors. The light-emitting device 1013 comprises an organic light-emitting diode, a sub-millimeter light-emitting diode, a micro light-emitting diode, and the like. The light-emitting device 1013 comprises an anode 1013a, a cathode 1013c, and a light-emitting layer 1013b. The light-emitting layer 1013b is disposed between the anode 1013a and the cathode 1013c and is located in a pixel definition area of a pixel definition layer 1014.

FIGS. 3A to 3G show a structure of the heat dissipation layer according to the present application. Referring to FIGS. 1D and 3A to 3D, the first heat dissipation portion 102a comprises a plurality of first protrusions 1021 arranged on one side of the first heat dissipation portion 102a away from the panel main body 101, so that the third surface 1021a is a non-flat surface.

Specifically, a portion of the third surface 1021a corresponding to the first body portion 101a comprises a plurality of the first protrusions 1021. Optionally, shapes of the first protrusions 1021 comprise at least one of a prismatic shape, a truncated pyramidal shape, a truncated conical shape, or a stepped shape. It should be noted that the first protrusions 1021 can have the same shape or different shapes.

The greater a number of the first protrusions 1021 of the first heat dissipation portion 102a, and/or the higher a height of each of the first protrusions 1021, the more advantageous it is to increase the surface area of the first heat dissipation portion 102a. Therefore, in order to improve heat dissipation capabilities of the first heat dissipation portion 102a, parameters such as the height of each of the first protrusions 1021 and an arrangement density of the first protrusions 1021 per unit area can be adjusted.

For example, the height of each of the first protrusions 1021 can be less than or equal to half of a thickness of the first heat dissipation portion 102a to ensure both a manufacturing process and heat dissipation performance That is to say, h1≤0.5T1, wherein T1 is the thickness of the first heat dissipation portion 102a, and h1 represents the height of any of the first protrusions 1021. Optionally, 18 μm≤T1≤50 μm, and 9 μm≤h1≤25 μm. It should be noted that the heights of the first protrusions 1021 can be equal or unequal. The height of each first protrusion 1021 can be determined according to a processing depth of a mold (e.g., a flat die-cutting mold and a hob die-cutting mold) used in a manufacturing process, and therefore the less the height of each first protrusion 1021, the less the processing depth of the mold, which reduces difficulty in manufacturing.

In order to reduce the difficulty of manufacturing and reduce processing steps and processing time, the heights of the first protrusions 1021 can be equal. Specifically, the heights of the first protrusions 1021 are 10 μm.

As to limitations on per unit area in relation to the panel main body 101, the first heat dissipation portion 102a comprises n first protrusions 1021 in a unit area of 1 mm×1 mm (i.e., 1 mm multiplied by 1 mm) corresponding to the panel main body 101. Wherein, n≥30, such that it can be ensured that the first heat dissipation portion 102a has good heat dissipation capabilities. Similarly, a unit length or a unit width can also be defined with reference to the panel main body 101, and the first heat dissipation portion 102a comprises n first protrusions 1021 per unit length or per unit width.

Figure 3A:
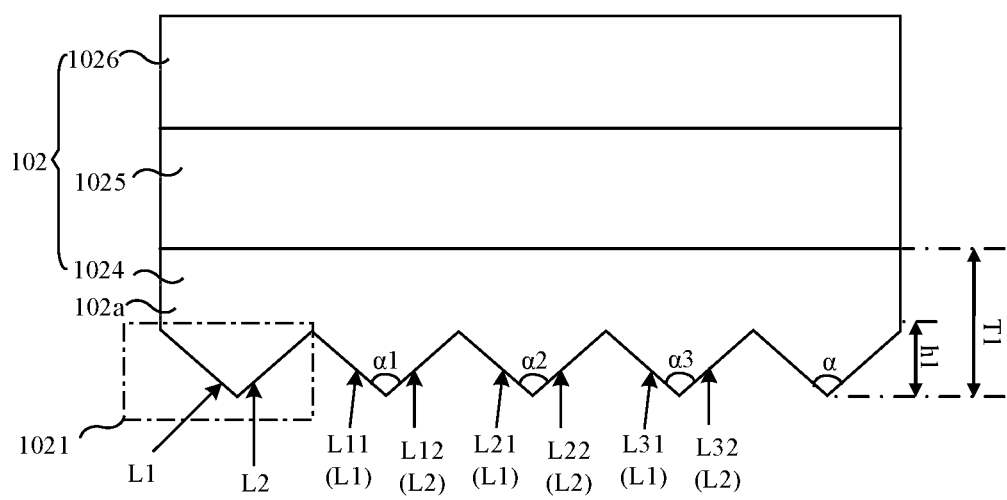
FIGS. 3A to 3G are schematic structural views illustrating a heat dissipation layer according to the present application.

For example, referring to FIG. 3A, the shape of each first protrusion 1021 comprises a prismic shape, and an axial section of each first protrusion 1021 comprises a first included angle α away from the panel main body 101. Wherein, the smaller the first included angle α, the higher the difficulty of the manufacturing process, and the more easily the first protrusions 1021 are deformed. Therefore, in order to ensure processability and heat dissipation performance, the first included angle α≥45°. Optionally, the first included angles α of the first protrusions 1021 can be same or different.

Specifically, each first protrusions 1021 comprises a first side L1 and a second side L2 connected to the first side L1, and the first side L1 and the second side L2 are located on one side of the first heat dissipation portion 102a away from the panel main body 101. The first side L1 of any one of the first protrusions 1021 has one end which is away from the second side L2 and connected to one end of the second side of the adjacent first protrusion 1021. The second side L2 of any one of the first protrusions 1021 has one end which is away from the first side L1 and connected to one end of the first side of the adjacent first protrusion 1021. The first side L1 and the second side L2 of any one of the first protrusions 1021 are connected to form the first included angle α.

In detail, the first protrusions 1021 comprise a first sub-protrusion, a second sub-protrusion, and a third sub-protrusion adjacent to one another, and the second sub-protrusion is located between the first sub-protrusion and the third sub-protrusion. A first side L11 and a second side L12 of the first sub-protrusion are connected to form a first sub-angle α1. A first side L21 and a second side L22 of the second sub-protrusion is connected to form a second sub-angle α2. A first side L31 and a second side L32 of the third sub-protrusion are connected to form a third sub-angle α3. One end of the first side L21 of the second sub-protrusion away from the second side L22 of the second sub-protrusion is connected to one end of the second side L12 of the first sub-protrusion away from the first side L11 of the first sub-protrusion. One end of the second side L22 of the second sub-protrusion away from the first side L21 of the second sub-protrusion is connected to one end of the first side L31 of the third sub-protrusion away from the second side L32 of the third sub-protrusion. The first included angle α comprises the first sub-angle α1, the second sub-angle α2, and the third sub-angle α3.

A transition curve can be used for joining any two adjacent first protrusions 1021, and/or the first side L1 and the second side L2 of any one of the first protrusions 1021. The transition curve is used to avoid fractures and breakage at an intersection of two adjacent first protrusions 1021.

Figure 3B:
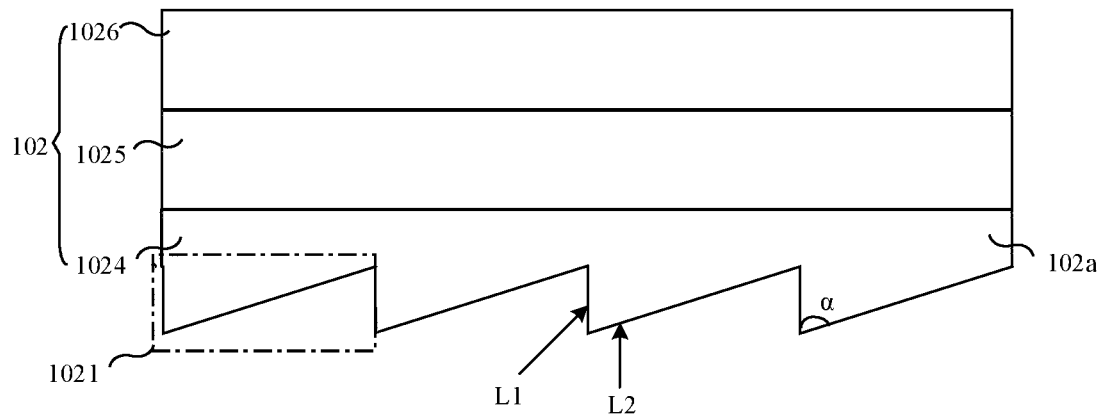
Figure 3C:
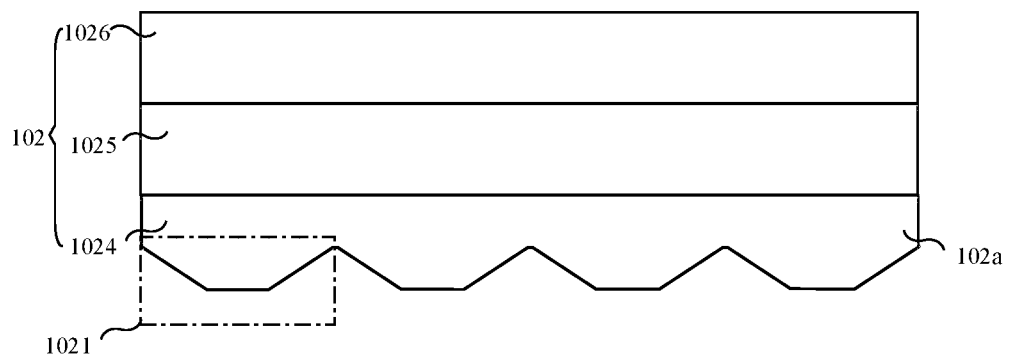

Optionally, the first side L1 or the second side L2 of each of the first protrusions 1021 can be arranged perpendicular to the panel main body 101, as shown in FIG. 3B.

Figure 3D:
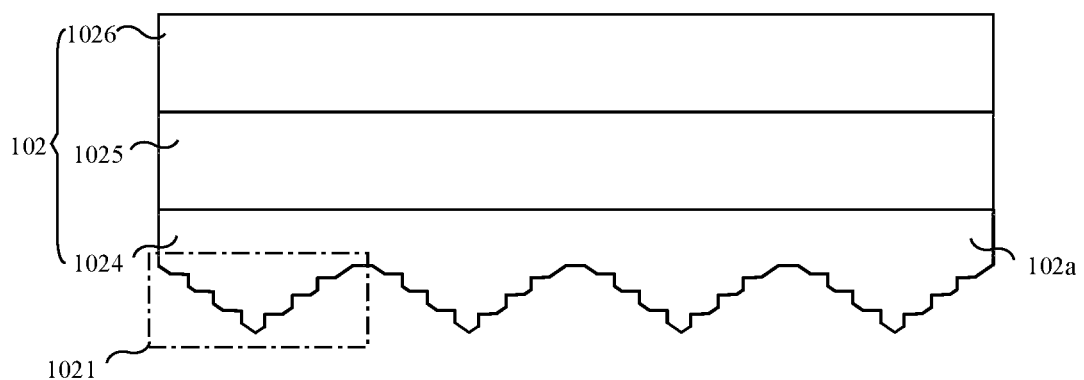
Figure 3E:
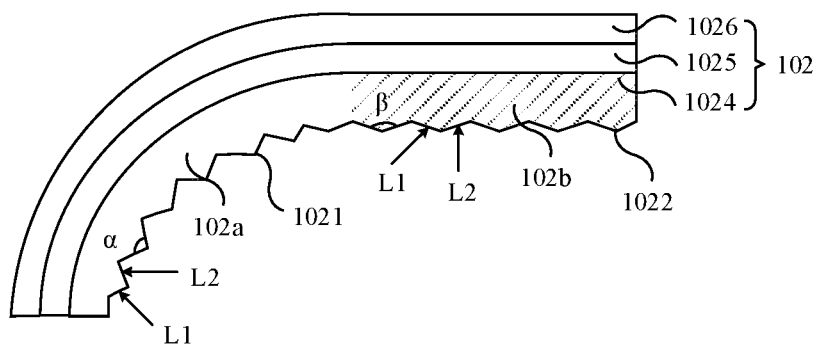

Optionally, in order to further increase the surface area of the first heat dissipation portion 102a and improve the heat dissipation performance of the display panel, the first protrusions 1021 can have a stepped shape, as shown in FIG. 3D. A number of steps of each first protrusion 1021 can be determined according to actual requirements, and a detailed description thereof is omitted herein.

Optionally, the arrangement density of the first protrusions 1021 per unit area can be adjusted by adjusting a spacing between the first protrusions 1021, so as to increase a heat dissipation area of the first heat dissipation portion 102a.

The display panel can comprise a plane area and at least one bending area at the same time, so the heat dissipation layer 102 can have different heat dissipation portions corresponding to the plane area and the at least one bending area to thereby improve the heat dissipation capabilities of the heat dissipation layer 102 according to characteristics of different regions of the display panel.

Specifically, please continue to refer to FIGS. 1A to 1D and FIGS. 3E to 3F. The panel main body 101 further comprises a second body portion 101b connected to a side portion of the first body portion 101a. The first body portion 101a has a first curvature, and the second body portion 101b has a second curvature less than the first curvature. The heat dissipation layer 102 comprises a second heat dissipation portion 102b corresponding to the second body portion 101b, and a surface of the second heat dissipation portion 102b on one side away from the panel main body 101 is a non-flat surface, so as to further increase a contact area of the heat dissipation layer 102 with the outside and improve the heat dissipation performance of the display panel.

Optionally, heat dissipation capabilities of the first protrusions 1021 per unit area is the same as or different from heat dissipation capabilities of the second protrusions 1022 per unit area. Furthermore, it is able to adjust the arrangement density of the first protrusions 1021, the arrangement density of the second protrusions 1022, and/or the heights of the first protrusions 1021 and the second protrusions 1022 per unit area, and/or the shapes and structures of the first protrusions 1021 and the second protrusions 1022, so as to make the heat dissipation capacity of the first protrusions 1021 per unit area different from the heat dissipation capacity of the second protrusions 1022 per unit area.

Optionally, the first body portion 101a and the second body portion 101b can be arranged corresponding to the bending area and the plane area of the display panel, respectively. Alternatively, the first body portion 101a and the second body portion 101b can be arranged corresponding to two bending areas with different curvatures in the display panel.

For convenience of describing the technical solutions of the present application, the present application is described by taking an example that the first body portion 101a is arranged corresponding to the bending area of the display panel, and the second body portion 101b is arranged corresponding to the plane area of the display panel.

When the second body portion 101b is arranged corresponding to the plane area, the second body portion 101b is in the flat state, and the second curvature of the second body portion 101b is 0. When the first body portion 101a is arranged corresponding to the bending area, the first body portion 101a is in the bent state, and the first curvature of the first body portion 101a is greater than the second curvature of the second body portion 101b.

The number of the first protrusions 1021 per unit area is greater than or equal to the number of the second protrusions 1022 per unit area. Further, because the number of the first protrusions 1021 per unit area is greater than the number of the second protrusions 1022 per unit area, bending performance of the first heat dissipation portion 102a is better than bending performance of the second heat dissipation portion 102b, thereby reducing a risk of poor adhesion between the heat dissipation layer 102 and the first body portion 101a, and ensuring good heat dissipation performance of the display panel at the first body portion 101a.

When the height of each of the first protrusions 1021 and the height of each of the second protrusions 1022 are equal, if the number of the first protrusions 1021 per unit area is greater than the number of the second protrusions 1022 per unit area, the surface area of the first heat dissipation portion 102a per unit area is greater than a surface area of the second heat dissipation portion 102b per unit area, so that the heat dissipation capacity of the first protrusions 1021 per unit area is greater than the heat dissipation capacity of the second protrusions 1022 per unit area. This is advantageous for the display panel to dissipate heat to the outside of the display panel through the heat dissipation layer 102 at the first body portion 101a and the second body portion 101b having different curvatures. The heat generated is conducted to the outside of the display panel through the heat dissipation layer 102, so as to avoid the problem of poor heat dissipation of the display panel.

Furthermore, the number of the first protrusions 1021 per unit area is n1, and the number of the second protrusions 1022 per unit area is n2, wherein 60≤n1≤120, and 30≤n2≤60, so that the bending performance of the first heat dissipation portion 102a is improved, and rigidity of a portion of the heat dissipation layer 102 corresponding to the first body portion 101a is reduced while good processability is also ensured. This is beneficial to reduce a bonding stress of the heat dissipation layer 102 when it is bonded to the first body portion 101a of the display panel, and also beneficial to reduce a risk of poor adhesion between the heat dissipation layer 102 and the panel main body 101.

Optionally, the heights of the first protrusions 1021 and the second protrusions 1022 are the same or different. Furthermore, the height of each of the first protrusions 1021 is less than or equal to half of the thickness of the first heat dissipation portion 102a, and/or the height of each of the second protrusions 1022 is less than or equal to half of a thickness of the second heat dissipation portion 102b, so as to ensure that the first heat dissipation portion 102a and/or the second heat dissipation portion 102b have good heat dissipation capabilities.

Further, in order to reduce the difficulty of manufacturing and save the manufacturing process and the processing time, the heights of the first protrusions 1021 and the second protrusions 1022 are equal. Specifically, the heights of the first protrusions 1021 and the second protrusions 1022 are 10 μm.

Optionally, the shapes of the first protrusion 1021 and/or the second protrusion 1022 comprise a prismatic shape, a semi-cylindrical shape, a truncated pyramidal shape, and a stepped shape.

If the first protrusions 1021 and the second protrusions 1022 all have the prismatic shape, the axial sections of the first protrusions 1021 all have the first included angle α away from the panel main body 101, axial sections of the second protrusions 1022 all have a second included angle β away from the panel main body 101, and the first included angle α is less than or equal to the second included angle β.

Furthermore, the larger the first included angle α and the second included angle β, the less obvious the increase in heat dissipation efficiency of the heat dissipation layer 102 at the first heat dissipation portion 102a and the second heat dissipation portion 102b. The smaller the first included angle α and the second included angle β are, the more difficult the manufacturing is. However, the smaller the first included angle α is, the greater the number of the first protrusions 1021 is arranged per unit area, and the more beneficial it is to improve the heat dissipation performance and the bending performance of the first heat dissipation portion 102a. Therefore, the first included angle α can be made smaller than the second included angle β. Specifically, referring to FIG. 3E, each of the first protrusions 1021 and the second protrusions 1022 includes the first side L1 and the second side L2, the first side L1 and the second side L2 of each first protrusion 1021 form the first included angle α, and the first side L1 and the second side L2 of each second protrusion 1022 form the second included angle β, wherein 45°≤α≤75°, and 75°≤β≤120°.

Figure 3F:
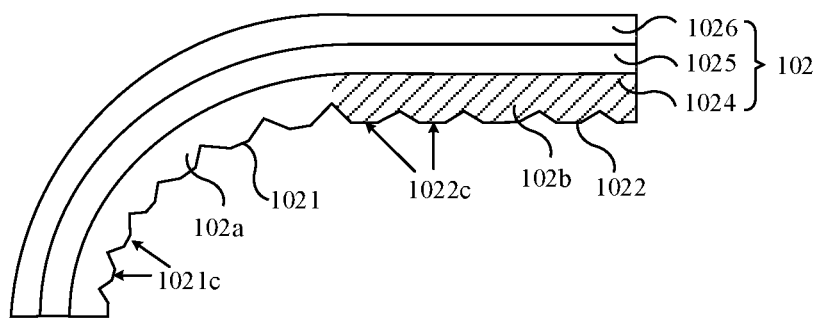

Please continue to refer to FIG. 3F. At least one of the first protrusions 1021 comprises a first side surface 1021c which is arranged on one side away from the panel main body 101 and parallel to a corresponding portion of the first body portion 101a, and/or at least one of the second protrusions 1022 comprises a second side surface 1022c which is arranged on one side away from the panel main body 101 and parallel to a corresponding portion of the second body portion 101b, thereby further increasing a heat dissipation area. The first protrusion 1021 comprises the first side surface 1021c which is arranged on one side away from the panel main body 101 and parallel to the corresponding portion of the first body portion 101a, so the bending performance of the first heat dissipation portion 102a is also improved, and the heat dissipation layer 102 has better bending resilience at a portion of the heat dissipation layer 102 corresponding to the first body portion 101a, and the rigidity at the portion of the heat dissipation layer 102 corresponding to the first body portion 101a is reduced, thereby reducing the bonding stress of the heat dissipation layer 102 when it is attached to the first body portion 101a of the display panel, which reduces a risk of cracks in the display panel, reduces a risk of poor adhesion between the heat dissipation layer 102 and the panel main body 101, and ensures that the display panel has good heat dissipation performance.

Optionally, the present application comprises a side surface which is arranged between any two adjacent first protrusions 1021 and parallel to a corresponding portion of the first body portion 101a; the present application can also comprise a side surface which is arranged between any two adjacent second protrusions 1022 and parallel to a corresponding portion of the second body portion 101b; and the present application can also have a side surface which is arranged between the first protrusion 1021 and the second protrusion 1022 and parallel to a corresponding portion of the panel main body 101.

Figure 3G:
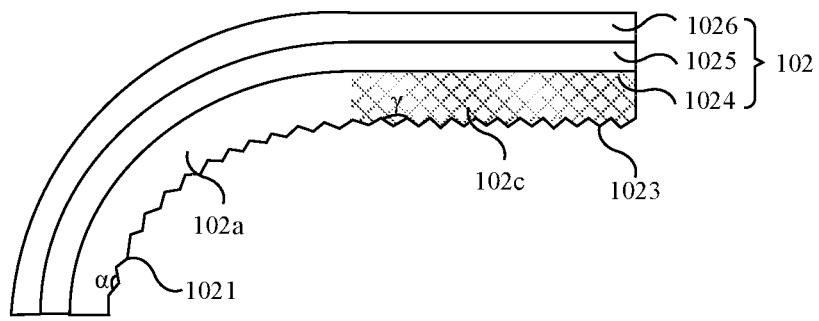

Please continue to refer to FIGS. 1A to 1B and 3G which still take as an example the first body portion 101a being arranged corresponding to the bending area of the display panel, and the second body portion 101b is arranged corresponding to the plane area of the display panel. The panel main body 101 further comprises a bonding portion 101c, the bonding portion 101c is connected to an end of the second body portion 101b, and the bonding portion 101c has a third curvature less than the first curvature; the heat dissipation layer 102 comprises a third heat dissipation portion 102c corresponding to the bonding portion 101c, and the third heat dissipation portion 102c comprises a plurality of third protrusions 1023 which are arranged on one side of the third heat dissipation portion 102c away from the panel main body 101.

Furthermore, the bonding portion 101c can be used to bond devices such as a flip chip film and a circuit board 106.

Furthermore, the number of the third protrusions 1023 per unit area is n3, wherein 50≤n3≤120, so as to ensure that the bonding portion 101c has better flatness for attachment and has a good detachment strength between interfaces, while also ensuring good heat dissipation performance of the third heat dissipation portion 102c. An axial section of each of the third protrusions 1023 has a third included angle γ away from the panel main body 101, wherein 45°≤γ≤90°, so as to ensure that the bonding portion 101c has better flatness for attachment and a good detachment strength between interfaces, while also ensuring good heat dissipation performance and processability of the third heat dissipation portion 102c. Optionally, shapes of the third protrusions 1023 comprise a prismatic shape, a semi-cylindrical shape, a truncated-pyramidal shape, and a stepped shape.

The first protrusions 1021, the second protrusions 1022, and the third protrusions 1023 can have the same or different shapes, arrangement densities, heights, and spacings.

The first heat dissipation portion 102a, the second heat dissipation portion 102b, and the third heat dissipation portion 102c corresponding to the first body portion 101a, the second body portion 101b, and the bonding portion 101c have differential designs (i.e., the first protrusions 1021, the second protrusions 1022, and the third protrusions 1023 are differentiated with respect to the arrangement densities, the heights, the first included angles α, the second angles β, and the third angles γ), and therefore an influence of the bonding stress on the panel main body 101 is reduced when the heat dissipation layer 102 is bonded, and the risk of poor adhesion between the panel main body 101 and the heat dissipation layer 102 is reduced, thereby ensuring good heat dissipation performance of the display panel.

Figure 4:
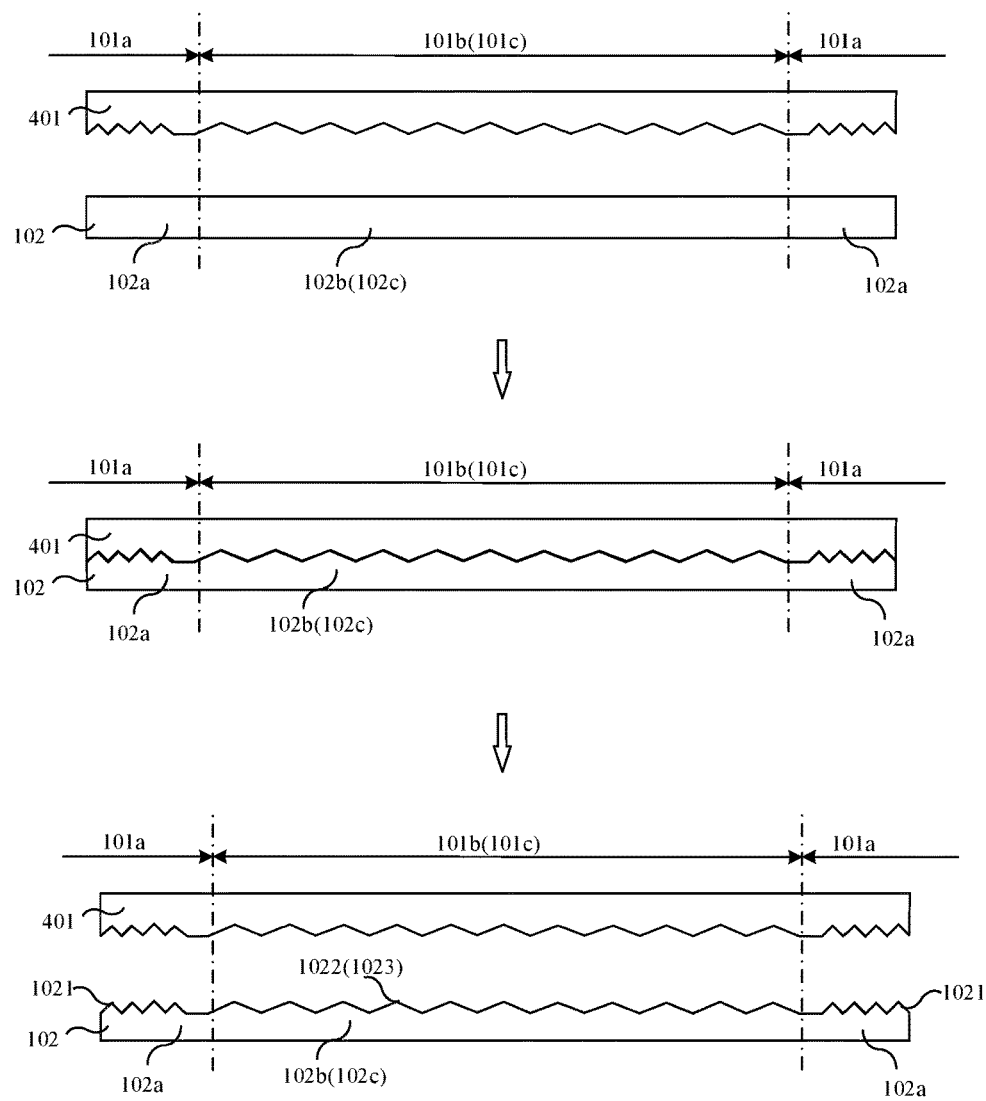
FIG. 4 is a schematic diagram illustrating manufacturing of first protrusions and/or second protrusions according to the present application.

Referring to FIGS. 3A to 3G, the first protrusions 1021, the second protrusions 1022, and the third protrusions 1023 can be formed by an imprinting process. Specifically, please refer to FIG. 4 which is a schematic view illustrating manufacturing of the first protrusions and/or the second protrusions according to one embodiment of the present application. An etching mold 401 is used to apply a certain load to a surface of the heat dissipation layer 102 to obtain the first protrusions 1021, the second protrusions 1022, and the third protrusions 1023. The etching mold 401 comprises a flat die-cutting mold and a hob die-cutting mold.

Since the heights of the first protrusions 1021, the second protrusions 1022, and the third protrusions 1023 are respectively affected by the processing depth of the etching mold and the thicknesses of the first heat dissipation portion 102a, the second heat dissipation portion 102b, and the third heat dissipation portion 102c. Therefore, in order to simplify the manufacturing process, the first protrusions 1021, the second protrusions 1022, and the third protrusions 1023 can be set to have the same height, and the heat dissipation performance of the display panel is adjusted by changing the shapes and the arrangement densities of the first protrusions 1021, the second protrusions 1022, and the third protrusions 1023.

Please continue to refer to FIGS. 1A to 1D. The heat dissipation layer 102 comprises a metal layer 1024, and the metal layer 1024 comprises the first heat dissipation portion 102a, the second heat dissipation portion 102b, and the third heat dissipation portion 102c.

Optionally, the metal layer 1024 is copper foil, so as to ensure that the display panel has good heat dissipation performance and achieve electromagnetic shielding, while reducing the influence of the bending stresses on the panel main body 101.

Furthermore, the heat dissipation layer 102 further comprises a thermally conductive layer 1025 and a buffer layer 1026. The thermally conductive layer 1025 is disposed between the buffer layer 1026 and the metal layer 1024, and the buffer layer 1026 is disposed between the panel main body 101 and the thermally conductive layer 1025.

Optionally, the buffer layer 1026 comprises a PET material or the like, and the thermally conductive layer 1025 comprises foam or the like. The heat dissipation layer 102 also comprises connection adhesive layers between the thermally conductive layer 1025 and the buffer layer 1026, between the metal layer 1024 and the thermally conductive layer 1025, and between the buffer layer 1026 and the panel main body 101, and other portions not shown.

Furthermore, the display panel further comprises a polarizer sheet 103, an optical adhesive 104, an encapsulation layer 105, a touch layer, and other portions not shown on the panel main body 101.

Figure 5:
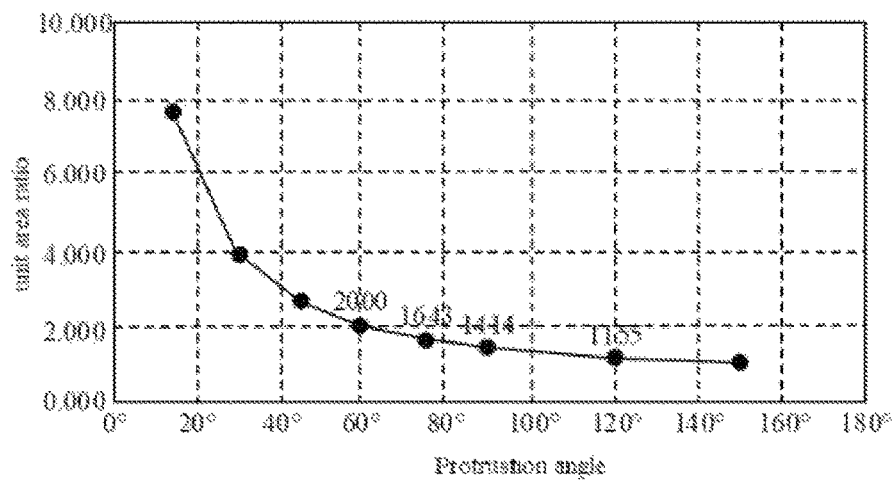
FIG. 5 is a schematic diagram of simulation results of heat dissipation efficiency per unit area in relation to a first included angle and/or a second included angle when the first protrusions and/or the second protrusions have a same width according to the present application.

FIG. 5 is a schematic view illustrating simulation results of protrusion angles and heat dissipation efficiency per unit area according to the present application. The protrusion angles comprise a first included angle α, a second included angle β, and a third included angle γ. It can be known from FIG. 5 that the higher a unit area ratio (i.e., a ratio of a surface area of the heat dissipation layer to a plane area under the condition of a fixed area or width in a plane), the higher the heat dissipation efficiency; as the protrusion angles increase, the unit area ratio decreases, and accordingly the heat dissipation efficiency is lowered. According to FIG. 5 and a convective heat transfer formula: Φ=AhΔt, Φ is a heat flow (in unit W), A is a heat exchange area, Δt is a temperature difference in the heat exchange area, and h is a surface heat transfer coefficient (in unit $W/m^2·K$). When the included angle ranges from 45° to 90°, an effective heat dissipation area is about 2 times to 1.4 times an effective heat dissipation area of a conventional design (i.e., a heat dissipation layer of a conventional design does not include first protrusions, and/or second protrusions, and/or third protrusions), so the present application can have good processability of the display panel (the smaller the protrusion angles are, the more difficult the processing is, the more difficult it is to control the shapes, and the easier it is to cause deformation) and have good heat dissipation efficiency (the larger the protrusion angles, the less obvious an increase in the heat dissipation efficiency).

Figure 6:
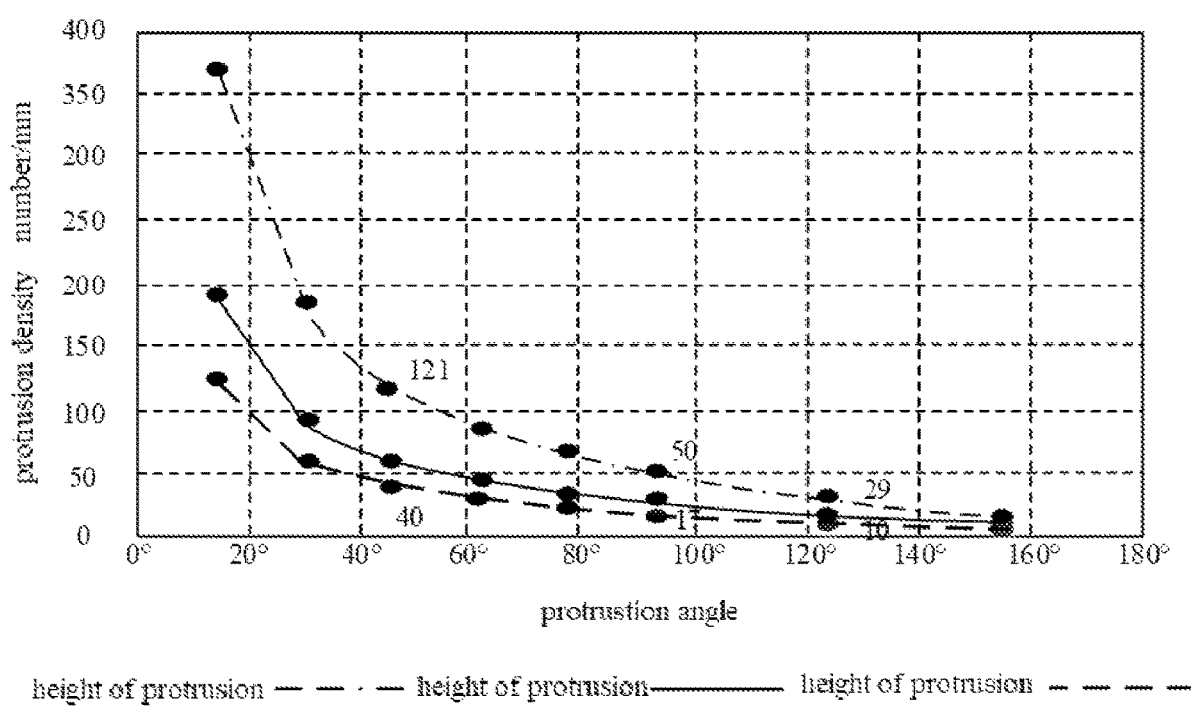
FIG. 6 is a schematic diagram illustrating a correlation between distribution densities and heights of the first protrusions and/or the second protrusions per unit area and the corresponding first included angle and/or the corresponding second included angle according to the present application.

FIG. 6 is a schematic view illustrating a correlation between protrusion densities (i.e., the arrangement densities), the heights and the included angles per unit area according to one embodiment of the present application. The protrusion densities are the number of the first protrusions, the number of the second protrusions, and the number of the third protrusions per unit area, and the included angles comprise the first included angles α, the second included angles β, and the third angles γ. It can be known from FIG. 6 that when the protrusion angle is fixed, the greater the height of the first protrusion, the second protrusion, or the third protrusion, the lower the protrusion density in the unit area. In the case where the height of the first protrusion, the second protrusion, or the third protrusion is fixed, the larger the included angle, the lower the protrusion density per unit area.

The present application further provides a display device comprising the above-mentioned display panel.

The above is a detailed description of a display panel and a display device of the present application. Specific examples are provided to illustrate the working principles and embodiments of the present application. The descriptions of the above embodiments are only used for ease of understanding the present application. Those skilled in the art can modify or change the embodiments and their applications according to the ideas of the present application. In summary, the content of this specification should not be construed as a limitation to the present application.

What is claimed is:

1. A display panel, comprising:
a panel main body comprising a first body portion; and
a heat dissipation layer disposed on one side of the panel main body, wherein the heat dissipation layer comprises a metal layer, the metal layer comprises a first heat dissipation portion corresponding to the first body portion, and a surface of the first heat dissipation portion on one side away from the panel main body is a non-flat surface,
wherein the first heat dissipation portion comprises a plurality of first protrusions arranged on one side of the first heat dissipation portion away from the panel main body; and
wherein a height of each of the first protrusions is less than or equal to half of a thickness of the first heat dissipation portion.

2. The display panel according to claim 1, wherein the first body portion and the first heat dissipation portion are in a bent state.

3. The display panel according to claim 1, wherein the panel main body further comprises a second body portion connected to a side portion of the first body portion, the first body portion has a first curvature, and the second body portion has a second curvature less than the first curvature; and the heat dissipation layer comprises a second heat dissipation portion corresponding to the second body portion, and the second heat dissipation portion comprises a plurality of second protrusions arranged on one side of the second heat dissipation portion away from the panel main body.

4. The display panel according to claim 3, wherein a number of the first protrusions per unit area is greater than or equal to a number of the second protrusions per unit area.

5. The display panel according to claim 4, wherein the number of the first protrusions per unit area is n1, and the number of the second protrusions per unit area is n2, wherein 60≤n1≤120, and 30≤n2≤60.

6. The display panel according to claim 3, wherein an axial section of each of the first protrusions comprises a first included angle away from the panel main body, an axial section of each of the second protrusions comprises a second included angle away from the panel main body, and the first included angle is less than or equal to the second included angle.

7. The display panel according to claim 6, wherein the first included angle is α and the second included angle is β, wherein 45°≤α≤75°, and 75°≤β≤120°.

8. The display panel according to claim 3, wherein the first protrusions and the second protrusions have a same height.

9. The display panel according to claim 8, wherein the height of each of the second protrusions is less than or equal to half of a thickness of the second heat dissipation portion.

10. The display panel according to claim 3, wherein the first protrusions and the second protrusions are formed by an imprinting process.

11. The display panel according to claim 3, wherein the second body portion is in a flat state, the panel main body further comprises a bonding portion connected to an end of the second body portion, and the bonding portion has a third curvature less than the first curvature; and the heat dissipation layer comprises a third heat dissipation portion corresponding to the bonding portion, and the third heat dissipation portion comprises a plurality of third protrusions on one side of the third heat dissipation portion away from the panel main body.

12. The display panel according to claim 11, wherein the metal layer further comprises the second heat dissipation portion and the third heat dissipation portion.

13. The display panel according to claim 12, wherein the metal layer is copper foil.

14. The display panel according to claim 12, wherein the heat dissipation layer further comprises a buffer layer and a thermally conductive layer, the thermally conductive layer is disposed between the buffer layer and the metal layer, and the buffer layer is disposed between the panel main body and the thermally conductive layer.

15. The display panel according to claim 3, wherein shapes of the first protrusions and/or the second protrusions comprise a prismatic shape, a semi-cylindrical shape, and a truncated pyramidal shape.

16. The display panel according to claim 3, wherein at least one of the first protrusions comprises a first side surface which is parallel to a corresponding portion of the first body portion and arranged on one side away from the panel main body; and/or at least one of the second protrusions comprises a second side surface which is parallel to a corresponding portion of the second body portion and arranged on one side away from the panel main body.

17. A display device, comprising a display panel, the display panel comprising:
   a panel main body comprising a first body portion; and
   a heat dissipation layer disposed on one side of the panel main body, wherein the heat dissipation layer comprises a metal layer, the metal layer comprises a first heat dissipation portion corresponding to the first body portion, and a surface of the first heat dissipation portion on one side away from the panel main body is a non-flat surface,
   wherein the first heat dissipation portion comprises a plurality of first protrusions arranged on one side of the first heat dissipation portion away from the panel main body; and
   wherein a height of each of the first protrusions is less than or equal to half of a thickness of the first heat dissipation portion.

18. The display device according to claim 17, wherein the panel main body further comprises a second body portion connected to a side portion of the first body portion, the first body portion has a first curvature, and the second body portion has a second curvature less than the first curvature; and the heat dissipation layer comprises a second heat dissipation portion corresponding to the second body portion, and the second heat dissipation portion comprises a plurality of second protrusions arranged on one side of the second heat dissipation portion away from the panel main body.

* * * * *